United States Patent [19]
Shirley et al.

[11] Patent Number: 5,663,919
[45] Date of Patent: Sep. 2, 1997

[54] MEMORY DEVICE WITH REGULATED POWER SUPPLY CONTROL

[75] Inventors: Brian M. Shirley; Manny K. F. Ma, both of Boise; Gordon Roberts, Meridian, all of Id.

[73] Assignee: Micron Technology, Inc., Boise, Id.

[21] Appl. No.: 608,444

[22] Filed: Feb. 28, 1996

[51] Int. Cl.$^6$ .................................................. G11C 5/14
[52] U.S. Cl. ........................................ 365/226; 365/229
[58] Field of Search .................................. 365/226, 229, 365/233.5, 189.08, 227

[56] References Cited

U.S. PATENT DOCUMENTS

| | | | |
|---|---|---|---|
| 4,627,034 | 12/1986 | Herndon | 365/226 |
| 5,027,053 | 6/1991 | Ohri et al. | 323/314 |
| 5,097,303 | 3/1992 | Taguchi | 365/226 |
| 5,235,550 | 8/1993 | Zagar | 365/226 |
| 5,245,230 | 9/1993 | Ohri et al. | 307/572 |
| 5,337,284 | 8/1994 | Cordoba et al. | 365/227 |
| 5,375,247 | 12/1994 | Hueser | 365/229 |
| 5,508,604 | 4/1996 | Keeth | 323/314 |
| 5,574,697 | 11/1996 | Manning | 365/226 |

*Primary Examiner*—Tan T. Nguyen
*Attorney, Agent, or Firm*—Schwegman, Lundberg, Woessner & Kluth, P.A.

[57] ABSTRACT

A memory device is described which includes a voltage regulator having a low power standby mode. A voltage regulator control circuit is described which places the voltage regulator in a high current mode when the outputs of the memory device are active. The regulator control circuit is operated in response to a combination of RAS*, CAS* and OE* signals.

16 Claims, 5 Drawing Sheets

MEMORY DEVICE WITH REGULATED POWER SUPPLY CONTROL

TECHNICAL FIELD OF THE INVENTION

The present invention relates generally to memory devices and in particular the present invention relates to the control of power supply regulators in memory devices.

BACKGROUND OF THE INVENTION

A wide variety of integrated circuit memories are available for storing data. One type of memory is the dynamic random access memory (DRAM). A DRAM is designed to store data in memory cells formed as capacitors. The data is stored in a binary format; for example a logical "one" can be stored as a charge on a capacitor, and a logical "zero" can be stored as a discharged capacitor. The typical DRAM has memory cells arranged in addressable rows and columns. To access a memory cell, a row is first addressed so that all memory cells coupled with that row are available for accessing. After a row has been addressed, at least one column can be addressed to pinpoint at least one specific memory cell for either data input or output. The data stored in the memory cells is, therefore, accessible via the columns.

With the constant development of faster computer and communication applications, the data rates in which a memory circuit must operate continue to increase. To address the need for increased data rates, a variety of DRAMs are commercially available. These memories are produced in a variety of designs which provide different methods of reading from and writing to the dynamic memory cells of the memory. One such method is page mode operation. Page mode operations in a DRAM are defined by the method of accessing a row of a memory cell array and randomly accessing different columns of the array. Data stored at the row and column intersection can be read and output while that column is accessed. Page mode DRAMs require access steps which limit the communication speed of the memory circuit.

An alternate type of memory circuit is the extended data output (EDO) memory which allows data stored at a memory array address to be available as output after the addressed column has been closed. This memory circuit can increase some communication speeds by allowing shorter access signals without reducing the time in which memory output data is available on the communication lines. Column access times are, therefore, "masked" by providing the extended data output. A more detailed description of a DRAM having EDO features is provided in the "1995 DRAM Data Book" pages 1—1 to 1—30 available from Micron Technology, Inc. Boise, Id., which is incorporated herein by reference.

Yet another type of memory device is a burst EDO memory which adds the ability to address one column of a memory array and then automatically address additional columns in a pre-determined manner without providing the additional column addresses on external address lines. These memory devices use a column address input to access the memory array columns.

Integrated memory devices often require relatively large currents during active operation and much lower currents during inactive modes. With the increases being achieved in memory density and the increased number of memories being incorporated into systems, such as personal computer systems, the power supply current requirements of individual memories must be carefully controlled. Thus, some random access memory devices (RAMs) have a standby mode which regulates the internal power supply to reduce power consumption when the memories are in an inactive state. These RAMs use the row address strobe signal (RAS*) signal as a control for the internal regulator circuitry. This creates problems with RAMs which can operate in an active mode after a *RAS cycle has ended.

For the reasons stated above, and for other reasons stated below which will become apparent to those skilled in the art upon reading and understanding the present specification, there is a need in the art for memory devices which regulate internal power supplies to reduce current demands while reducing electrical noise experienced during memory operation.

SUMMARY OF THE INVENTION

The above mentioned problems with regulating power supplies in memory devices and other problems are addressed by the present invention and which will be understood by reading and studying the following specification. Power supply regulation circuitry is described which maintains a high current supply while the data communication lines are active.

In particular, the present invention describes a memory device comprising a voltage regulator having first and second operating states, and a voltage regulator control coupled to the voltage regulator. The voltage regulator control comprises a first input connected to a row address strobe signal, a second input connected to a column address strobe signal, and an output coupled to the voltage regulator. The output provides an output signal which activates the second operating state of the voltage regulator when either the row address strobe signal or the column address strobe signal is active.

In another embodiment a memory device is described which comprises a voltage regulator having a low current mode and a high current mode, and a voltage regulator control coupled to the voltage regulator. The voltage regulator control comprises a first input connected to a row address strobe signal, a second input connected to a column address strobe signal, an output coupled to the voltage regulator, and a control circuit. The control circuit is connected to the first input, the second input and the output of the voltage regulator control for producing an output signal. The output signal activates the high current mode of the voltage regulator when the row address strobe signal transitions to an active state and activates the low current mode when the later of the row address strobe or the column address strobe signal transitions to an in-active state.

A method of controlling a voltage regulator in a memory device is described. The voltage regulator has a low current mode and a high current mode. The method comprises the steps of activating the high current mode in response to an active transition of a row address strobe signal, and activating the low current mode in response to a second external signal.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

Random access memories (RAMs) are available in a wide variety of styles, including but not limited to page mode DRAMs, EDO DRAMs, synchronous DRAMs and BEDO DRAMs. Further, RAMs are currently available in a variety of sizes ranging from 256 k to 16 mega bits. Because of the constant changes in memory options, the current invention is intended to cover all random access memories regardless of style or size.

Figure 1:
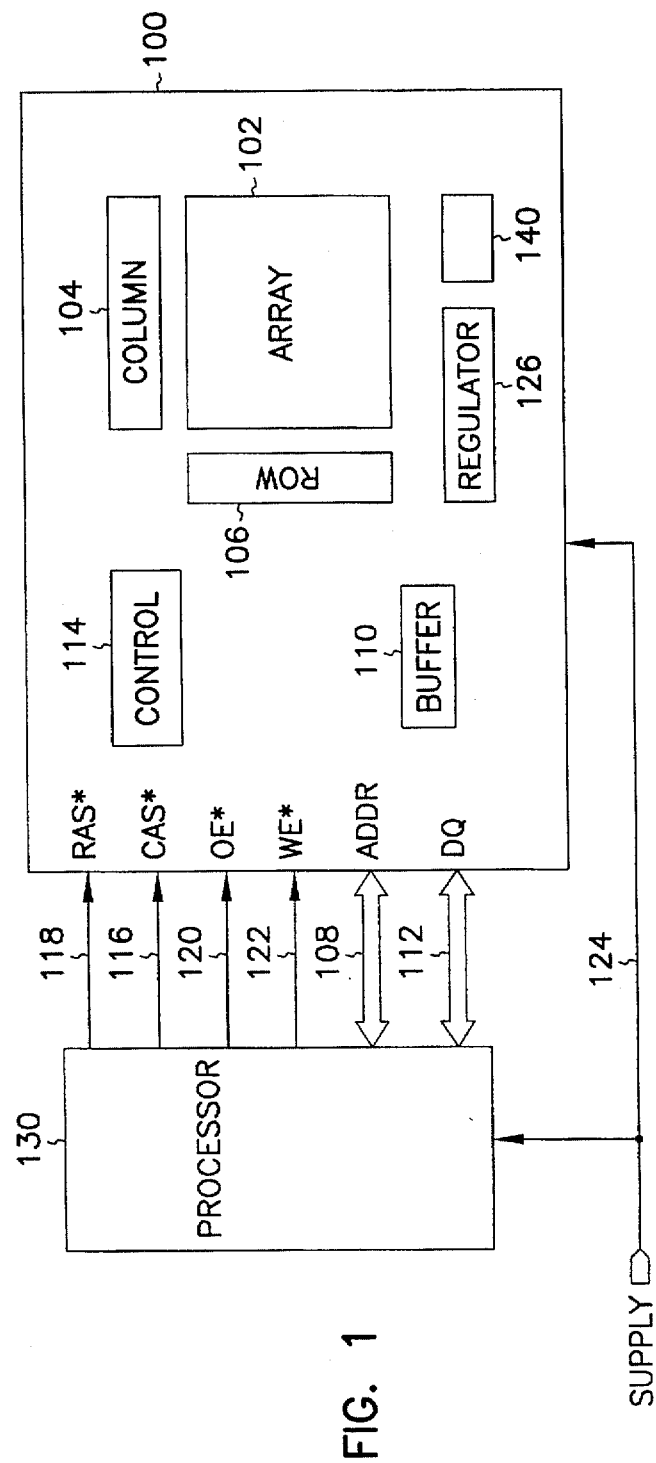
FIG. 1 is a block diagram of a system having random access memory.

FIG. 1 is a block diagram of a typical system having a random access memory 100 incorporating the present invention. The memory includes a memory array 102 having addressable memory cells. Column 104 and row 106 decoders are provided to decode addresses provided on address lines 108 and access appropriate memory cells of the array. Input/output buffer 110 is provided for data communication with a processor via data communication lines 112, DQs. Control circuitry 114 controls the operation of the memory in response to inputs including column address strobe 116 (CAS*), row address strobe 118 (RAS*), output enable 120 (OE*), and write enable 122 (WE*).

Figure 2:
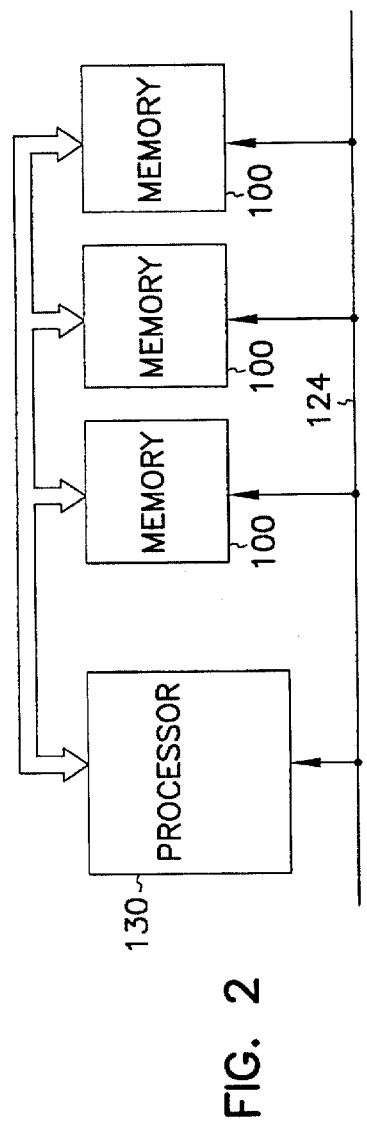
FIG. 2 is a block diagram of an alternate system having multiple random access memories.
Figure 3:
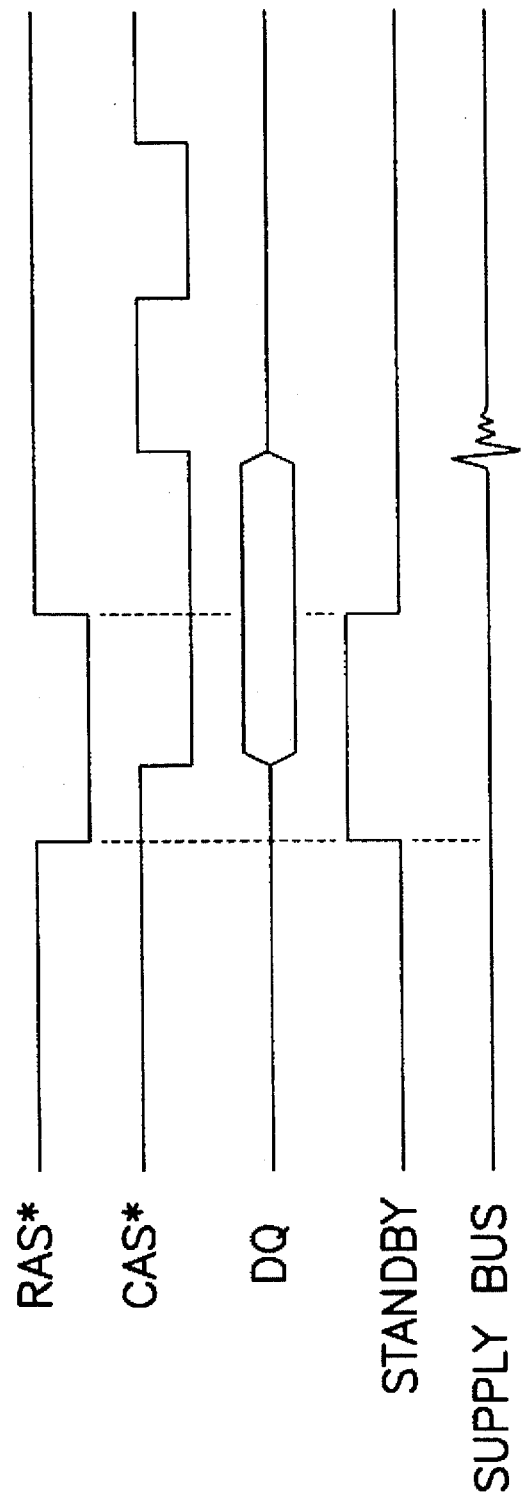
FIG. 3 a timing diagram of a prior art RAM.

A common supply bus 124 can be used to provide power to the processor 130 and the memory 100. It will be appreciated that multiple memories can be used in the system to communicate with the processor, as illustrated in FIG. 2. As stated above, to reduce power consumption, the RAM has a standby mode. The standby mode is accomplished using a voltage regulator 126 having a low regulation/low current mode (standby mode) and a high regulation/high current mode. Typical memories trigger the standby mode using RAS* to control a standby signal, as illustrated in FIG. 3. That is, the regulator circuit operates in the high current mode when the standby signal is high (RAS* low).

Because the standby signal follows RAS*, the regulator reduces the instantaneous current available to the memory regardless of the state of either CAS* or the DQ lines. Current JEDEC standards require that the DQ lines remain active while CAS* is low. Two problems have been experienced during read operations as a result of prematurely de-activating the regulator circuit's high current mode while the DQ lines are active. The first problem is that substantial electrical noise is coupled to the supply bus as a result of CAS* transitions, shown in FIG. 3. When CAS* returns high, a large amount of internal switching current is demanded which cannot be instantaneously supplied by the low current regulator mode. The second problem experienced is electrical noise coupled to the DQ lines when the voltage regulator switches from a high current mode to a low current mode while the DQ lines are active. It will be appreciated by those skilled in the art that electrical noise on either the supply bus or the communication lines increases the risk of erroneous data communication.

Figure 4:
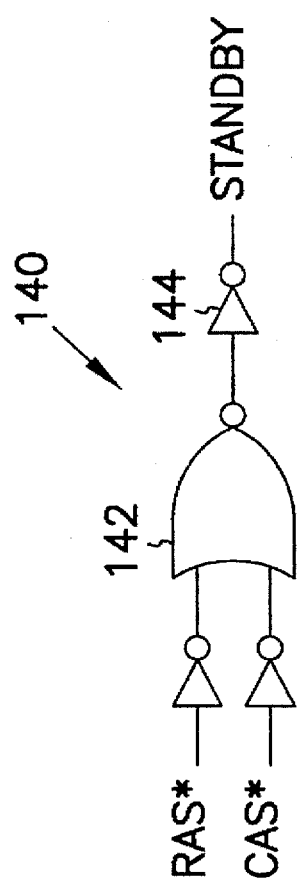
FIG. 4 is a schematic diagram of a power supply control of the present invention.
Figure 5:
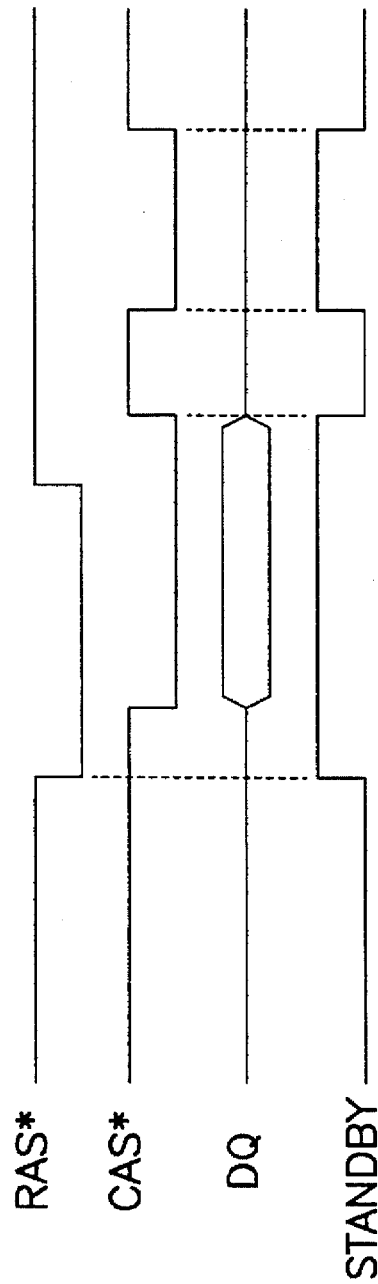
FIG. 5 is a timing diagram of the power supply control of FIG. 4.

The memory of FIG. 1 includes a voltage regulator control circuit 140 which activates the appropriate supply current mode such that the high current mode is active when the row address strobe signal and/or DQ lines are active. One embodiment of the regulator control circuit is illustrated in FIG. 4. The regulator control circuit includes a NOR logic gate 142 having two inputs to receive inverted RAS* and CAS* signals. A high signal on the output of invertor 144 is used to activate the high regulation/high current mode of the voltage regulator, as illustrated in FIG. 5. It will be appreciated by those skilled in the art that other logic circuitry can be used for control 140 to activate the high regulation/high current mode of the voltage regulator when CAS* is active.

The above described regulator control circuit will activate the high regulation/high current mode of the voltage regulator whenever either CAS* or RAS* is low, which can waste power. That is, CAS* can go low independent of RAS* even though the DQ lines cannot be activated without CAS* transitioning low when RAS* is low. An alternate embodiment of voltage regulator control circuitry 140 shown in FIG. 6, can be used in the memory of FIG. 1 to insure that the high regulation/high current mode of the voltage regulator is active when the row address strobe and/or the DQ lines are active.

Figure 6:
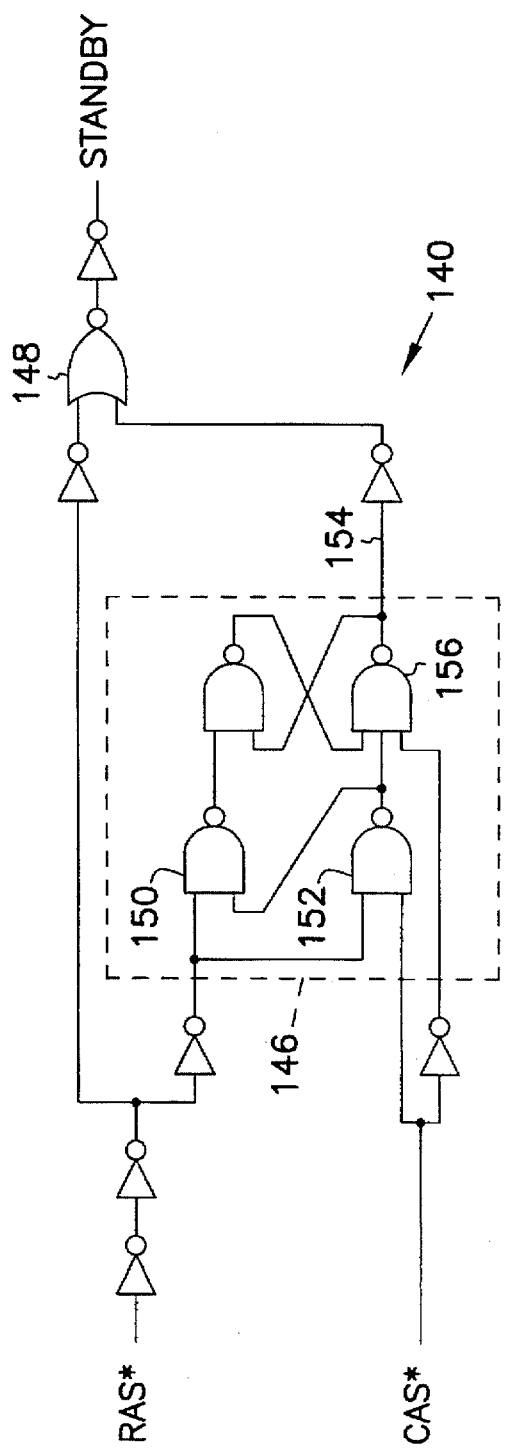
FIG. 6 is a schematic diagram of an alternate power supply control of the present invention.
Figure 7:
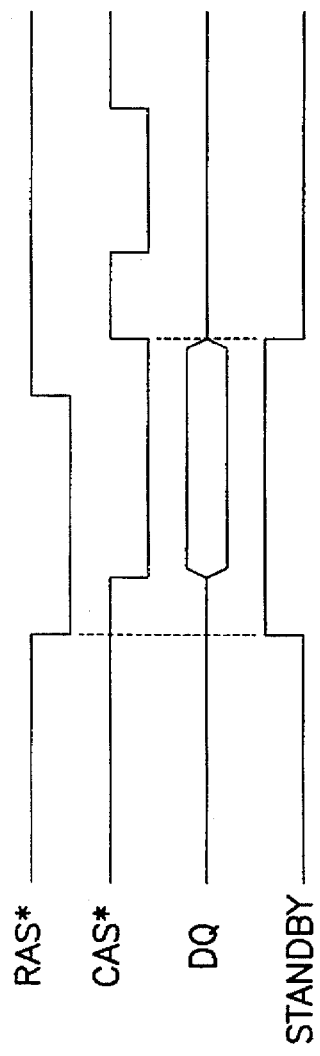
FIG. 7 is a timing diagram of the power supply control of FIG. 6.

The voltage regulator control circuit of FIG. 6 includes a latch 146 which is "enabled" when RAS* is activated, and disabled when the later of either RAS* or CAS* transitions high. In operation, when RAS* transitions low, the output of NOR gate 148 goes low and the standby signal goes high, see FIG. 7. In response to an active RAS* signal, one of the inputs to NAND gates 150 and 152 of latch 146 go high. When CAS* is activated (low transition) the output of NAND gate 152 goes low and the output of NAND gate 150 goes high. Latch 146 is, therefore, latched such that the output 154 is low. If RAS* transitions high before CAS*, the latch output remains low and NOR gate 148 continues to hold the standby signal high. When CAS* goes high, the output of NAND gate 156 of the latch 146 will go high and the standby signal will go low.

Figure 8:
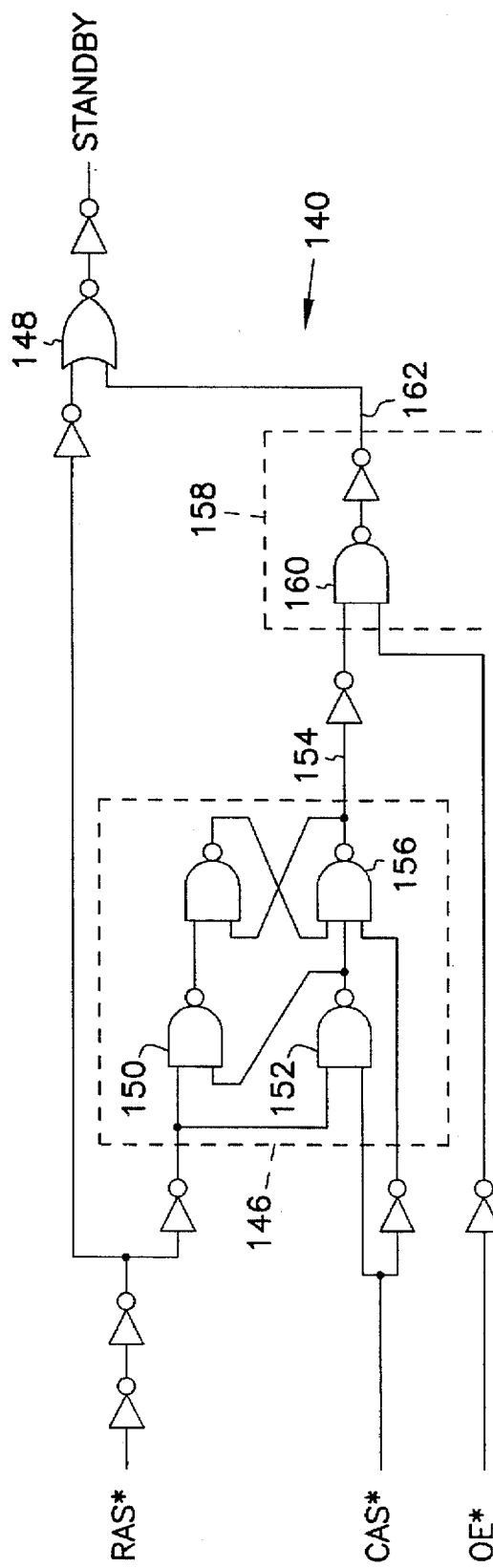
FIG. 8 is a schematic diagram of an alternate power supply control of the present invention.
Figure 9:
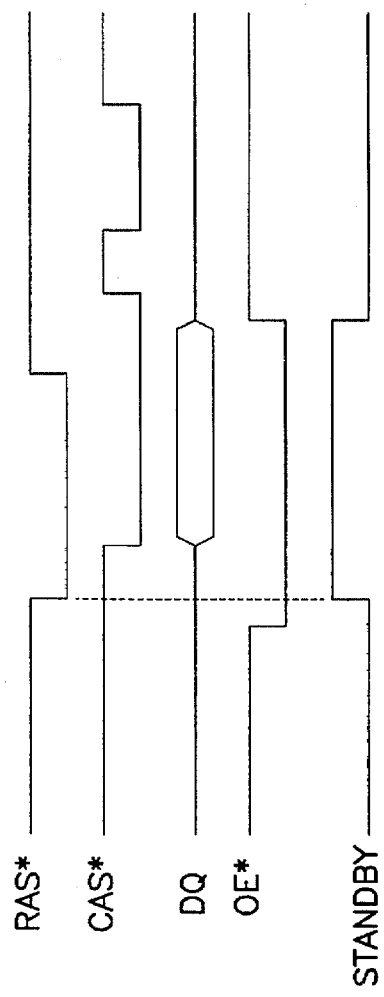
FIG. 9 is a timing diagram of the power supply control of FIG. 8.

The output enable signal 120 (OE*) can be used with the control circuit 140 such that the high regulation/high current mode of the voltage regulator is deactivated if the DQ lines are disabled during a read operation prior to both CAS* and RAS* going high. FIG. 8 illustrates a regulator control 140 which includes a disable circuit 158 which resets the standby signal when OE* goes high after RAS* goes high. Thus if the OE* signal transitions high before CAS*, the output of NAND gate 160 will go high, and the standby signal will go low in response, see FIG. 9.

CONCLUSION

A voltage regulator control circuit has been described which places the voltage regulator in a high regulation/high current mode when the outputs of a random access memory are active. The regulator control circuit is operated in response to a combination of RAS*, CAS* and OE* signals.

A memory incorporating the regulator control circuit has a reduced power consumption by utilizing a low regulation/low current mode when power demand is low, and eliminates electrical noise experienced when the high regulation/high current mode of the voltage regulator is deactivated when the outputs are active.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
   a voltage regulator having first and second operating states; and
   a voltage regulator control coupled to the voltage regulator comprising,
   a first input connected to a row address strobe input for receiving a row address strobe signal,
   a second input connected to a column address strobe input for receiving a column address strobe signal, and
   an output coupled to the voltage regulator, the output providing an output signal which activates the second operating state of the voltage regulator when either the row address strobe signal or the column address strobe signal is active.

2. The memory device of claim 1 wherein the first operating state of the voltage regulator is a low current mode, and the second operating state of the voltage regulator is a high current mode.

3. The memory device of claim 1 wherein the voltage regulator control further comprises:
   a control logic circuit connected to the first and second input and the output for producing the output signal in response to the first and second inputs.

4. The memory device of claim 3 wherein the control logic circuit comprises:
   a NOR gate having a first input coupled to the first input of the voltage regulator control, a second input coupled to the second input of the voltage regulator control, and an output coupled to the output of the voltage regulator control.

5. The memory device of claim 1 wherein the memory device is a dynamic random access memory (DRAM).

6. A memory device comprising:
   a voltage regulator having a low current mode and a high current mode; and
   a voltage regulator control coupled to the voltage regulator comprising,
   a first input connected to a row address strobe input for receiving a row address strobe signal,
   a second input connected to a column address strobe input for receiving a column address strobe signal,
   an output coupled to the voltage regulator, and
   a control circuit connected to the first input, the second input and the output of the voltage regulator control for producing an output signal which activates the high current mode of the voltage regulator when the row address strobe signal transitions to an active state and activates the low current mode when the later of the row address strobe signal or the column address strobe signal transitions to an inactive state.

7. The memory device of claim 6 wherein the control circuit comprises:
   a latch circuit coupled to both the row address strobe input and the column address strobe input; and
   logic circuitry coupled to the latch circuit, the row address strobe input, and the output of the voltage regulator control.

8. The memory device of claim 7 wherein the logic circuitry comprises:
   a NOR gate having a first input coupled to the row address strobe input, a second output coupled to the latch input, and an output coupled to the output of the voltage regulator control.

9. The memory device of claim 7 wherein the latch circuit comprises:
   a first stage circuit having a first input coupled to the row address strobe input, and a second input coupled to the column address strobe input; and
   a second stage circuit connected to the first stage circuit, the second stage circuit having a third input coupled to the column address strobe input for receiving an inverted column address strobe signal, and an output for providing an output signal which transitions to a first logic state in response to the row address strobe signal transitioning to an active state, latches the output signal in the first logic state in response to the column address strobe signal transitioning to an active state, and transitions to a second logic state when the column address strobe signal transitioning to an in-active state.

10. The memory device of claim 7 wherein the control circuit further comprises:
    reset logic having an input coupled to an output enable input for receiving an output enable signal and an output coupled to the logic circuitry for activating the low current mode of the voltage regulator when the output enable signal transitions to an in-active state.

11. The memory device of claim 10 wherein the reset logic comprises a NAND gate having a first input coupled to the latch circuit, a second input coupled to the output enable input, and an output coupled to the logic circuitry.

12. The memory device of claim 6 wherein the memory device is a dynamic random access memory (DRAM).

13. A method of controlling a voltage regulator in a memory device, the voltage regulator having a low current mode and a high current mode, the method comprising the steps of:
    activating the high current mode in response to an active transition of a row address strobe signal; and
    activating the low current mode in response to a second external signal.

14. The method of claim 13 wherein the second external signal is a column address strobe signal.

15. The method of claim 13 wherein the step of activating the low current mode comprises the steps of:
    latching the voltage regulator in the high current mode in response to an active transition of a column access strobe signal following the active transition of the row address strobe signal; and
    activating the low current mode in response to an in-active transition of the column address strobe signal.

16. The method of claim 13 wherein the step of activating the low current mode comprises the steps of:
    receiving an in-active transition of an output enable signal; and
    activating the low current mode in response to the in-active transition of the output enable signal.

* * * * *